United States Patent
Giddens et al.

(10) Patent No.: US 6,701,494 B2
(45) Date of Patent: Mar. 2, 2004

(54) METHOD OF USING TESTBENCH TESTS TO AVOID TASK COLLISIONS IN HARDWARE DESCRIPTION LANGUAGE

(75) Inventors: L. Grant Giddens, Raleigh, NC (US); Ronald R. Munoz, Raleigh, NC (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 0 days.

(21) Appl. No.: 10/137,846

(22) Filed: May 1, 2002

(65) Prior Publication Data

US 2003/0208729 A1 Nov. 6, 2003

(51) Int. Cl.[7] .......................... G06F 17/50; G06F 9/455
(52) U.S. Cl. .................... 716/4; 716/5; 716/6; 716/16; 716/17; 703/14; 703/27
(58) Field of Search ............................ 716/4, 5, 6, 16, 716/17

(56) References Cited

U.S. PATENT DOCUMENTS

| | | | | |
|---|---|---|---|---|
| 4,760,330 A | * | 7/1988 | Lias, Jr. ........................ | 714/32 |
| 5,974,241 A | * | 10/1999 | Fusco ............................ | 716/2 |
| 6,134,516 A | * | 10/2000 | Wang et al. .................. | 703/27 |
| 6,339,837 B1 | * | 1/2002 | Li .................................. | 716/5 |
| 6,389,379 B1 | * | 5/2002 | Lin et al. ...................... | 703/14 |
| 6,487,704 B1 | * | 11/2002 | McNamara et al. ........... | 716/5 |
| 6,498,999 B1 | * | 12/2002 | Reise ........................... | 702/120 |
| 6,513,143 B1 | * | 1/2003 | Bloom et al. .................. | 716/3 |
| 2002/0083420 A1 | * | 6/2002 | Zammit et al. .............. | 717/135 |
| 2002/0161564 A1 | * | 10/2002 | Baco ............................ | 703/13 |

* cited by examiner

*Primary Examiner*—Matthew Smith
*Assistant Examiner*—Andrea Liu
(74) *Attorney, Agent, or Firm*—Fogg and Associates, LLC; Scott V. Lundberg

(57) ABSTRACT

A method and system for performing simultaneous tests and avoiding task collisions using a hardware description language includes designating a timeslot for one or more of the simultaneous tests, associating the designated timeslot with one or more of the tasks to be performed in a test, determining if the designated timeslot is available before executing the tasks associated with timeslots and executing the tasks when the designated timeslots become available.

19 Claims, 2 Drawing Sheets

METHOD OF USING TESTBENCH TESTS TO AVOID TASK COLLISIONS IN HARDWARE DESCRIPTION LANGUAGE

TECHNICAL FIELD

The present invention is related in general to hardware description languages (HDLs) and in particular to a method of performing testbench tests in a HDL to avoid task collisions.

BACKGROUND INFORMATION

Hardware description languages (HDLs) are high level languages used to design, test, and document electronic systems. HDLs allow designers to design at various levels of abstraction. There are several HDLs currently in use. Among them are Verilog and VHDL.

When designing a field programmable gate array (FPGA), an applications specific integrated circuit (ASIC), or other logic device, a simulation environment that includes a "testbench" and the design under test (DUT) must be created. This environment allows tests to be generated to check the functionality of the logic device that has been created in the HDL. In many instances these tests, which are usually written in the same HDL as the DUT, must communicate with the logic device through a common interface such as a microprocessor interface. The logic device may have many internal blocks of unrelated logic, but must interface through the microprocessor interface, which can present a bottleneck. For example, if two tests are run at the same time, both tests may call tasks that attempt to access the microprocessor interface at the same time, which can cause a test bench task collision. If this occurs, the results can be undeterminable. The present invention provides a method to run concurrent tests on a logic device under test and avoid the problem of task collisions, thus resulting in considerable time savings in the HDL design process.

SUMMARY

A method for performing simultaneous tests and avoiding task collisions in a hardware description language includes designating a timeslot for a plurality of simultaneous tests, associating the designated timeslot with one or more tasks to be performed, determining if the designated timeslot is available before executing a task and executing the task when the designated timeslot becomes available.

DETAILED DESCRIPTION

In the following detailed description of the preferred embodiments, reference is made to the accompanying drawings that form a part hereof, and in which are shown by way of illustration specific embodiments in which the invention may be practiced. It is to be understood that other embodiments may be utilized and structural changes may be made without departing from the scope of the present invention.

Figure 1:
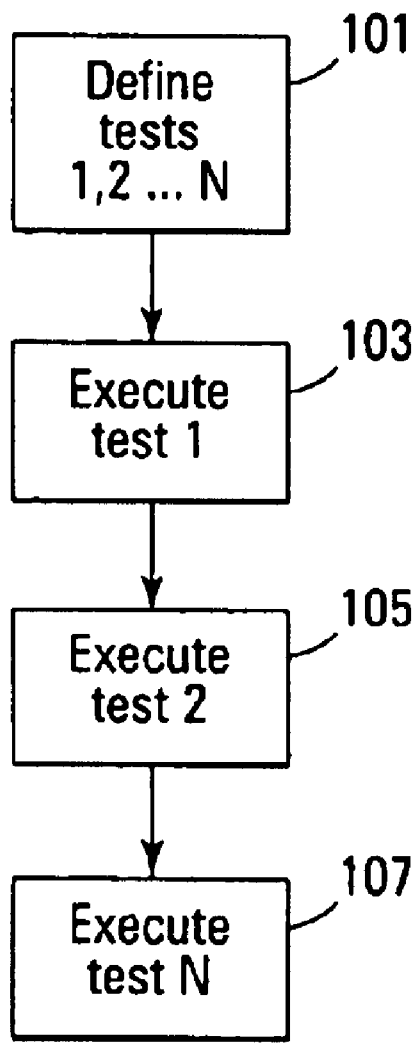
FIG. 1 is an illustration of one example of a prior art HDL testbench system.

Many logic designs are created in a high-level HDL such as Verilog or VHDL. Thorough testing of the device is an important part of the design process and involves the performance of many tests, each of which may include a number of individual tasks. These tasks are typically defined once and called multiple times in the performance of one or more tests. For example, Verilog supports tasks that can be defined once, but are called many times to perform a common task, such as a microprocessor read or write. Even though tests are typically performed on a number of separate parts of the DUT, many tests must still be run sequentially to make sure no task collisions occur. Typically, the highest risk of a task collision is at the microprocessor interface. Since several tests might be able to test different parts of the logic device simultaneously, it would make sense to run the tests concurrently so that the time spent during simulation is minimized if task collisions could be avoided. FIG. 1 shows an example of how the problem of task collisions in an HDL testbench environment have been handled in the past. Step 101 defines the various tests in the HDL testbench. In steps 103, 105 and 107 the tests are run sequentially, i.e., at a different time to ensure that task collisions are avoided.

The method of the present invention enables multiple HDL tests to be run simultaneously. To avoid the possibility of a task collision, the present invention enables each task to be performed and completed before other, potentially conflicting, tasks are allowed to perform.

To implement the invention of the present application, one must determine how many clock cycles the tasks in question will take to complete and how many tests will be performed at the same time. Once this has been determined, unique timeslots can be assigned to one or more of the tests to be performed simultaneously such that each timeslot will allow for tasks of a test to be completed during the designated timeslot. In this way, advantageously, a number of tests can be performed at the same time, and result in considerable time savings in an HDL verification process.

Figure 2:
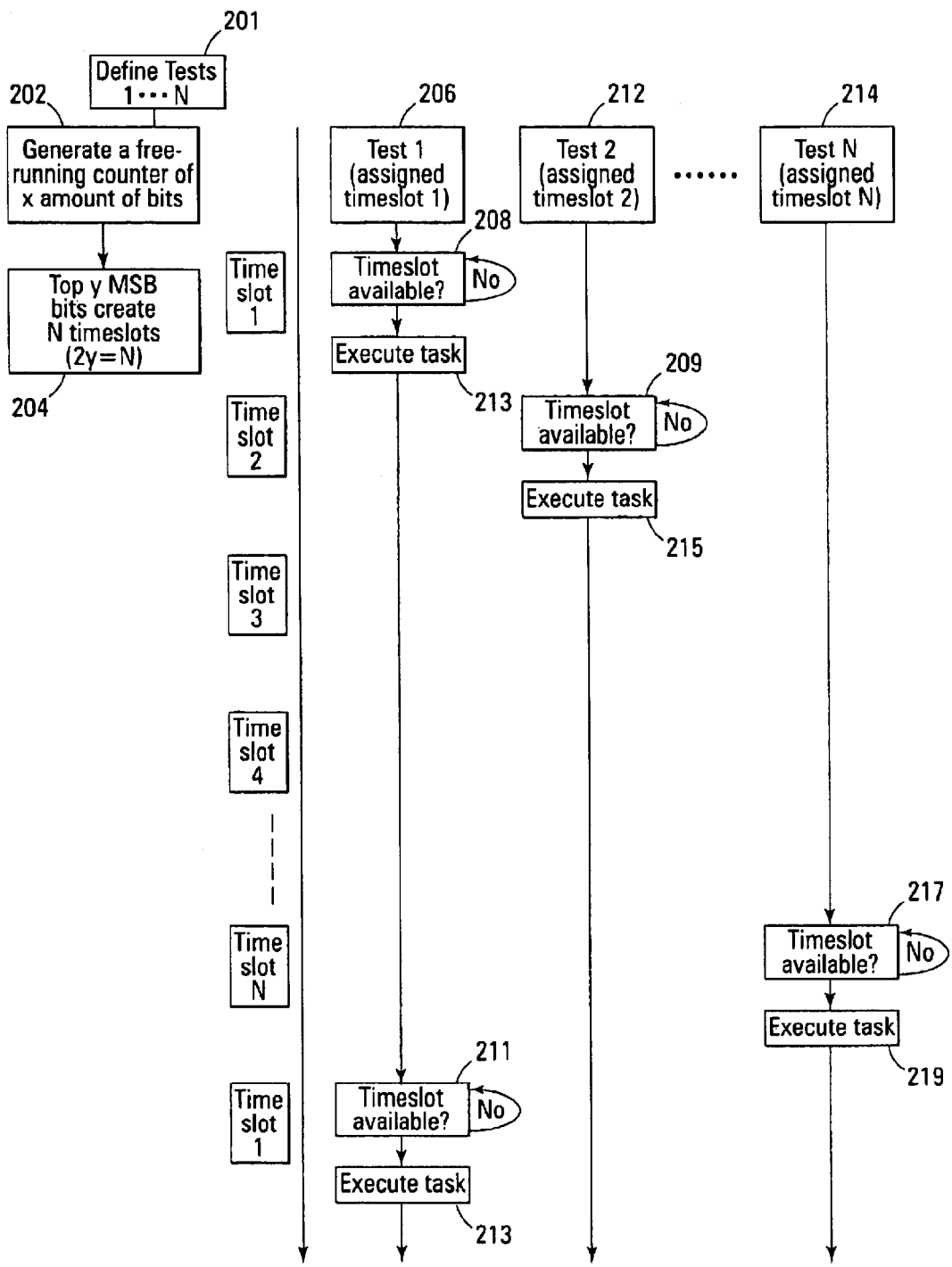
FIG. 2 is an illustration of one example of a system according to the teachings of the present invention.

FIG. 2 illustrates a method of running simultaneous HDL tests according to the present invention. Step 201 defines the various tests to be performed in the top level of the testbench and assigns a timeslot to each test. Each task may be evaluated to determine whether it may collide with a task of another test. If the task may potentially collide with any other task, the task is put in the timeslot corresponding to the timeslot assigned to the test to which it belongs. Thus, the task should be defined to include a discrete timeslot symbol or input variable to let it know which timeslot it is to use. The number of bits of the input variable will depend on the number of timeslots required. If the task is certain not to collide with any other task a timeslot is not necessary and may be skipped for that task. After determining the number of clock cycles needed to perform the longest task, timeslots are created by generating a counter in step 202 in the top level test bench of the HDL. For simplicity, a single counter is used to count both timeslots and time. The number of bits in the counter should be sufficient to allow enough time for the longest task of any of the tests to be completed and also to count the number of timeslots needed for the tests to be performed simultaneously. For example, if the longest task takes 10 clock cycles to be performed, and there will be two timeslots, the counter should have at least 5 bits. As many tests as there are timeslots available can be run simultaneously. If more tests are to be run simultaneously additional bits can be added to the counter. For example, to allow for up to 8 timeslots, and a timeslot of up to 16 clock cycles, the counter should have at least 7 bits. In this case, the bottom least significant 4 bits may be used to provide the time to make sure the task can be completed in the up to 16 clock cycles and the top most significant 3 bits at step 204 will allow for 8 different timeslots. These can be used to make sure that the tests 206, 212 and 214 running concurrently will not have task collisions.

When a task is called, the assigned timeslot must be passed to it. At step 206, test 1, which has been assigned timeslot 1, is called. The process checks at step 208 to see if timeslot 1 is indeed available. If it is not, test 1 waits at step 208 until the timeslot is available. Once timeslot 1 becomes available, the task executes at 210. If another task is to be executed as a part of test 1, the process again checks to see if timeslot 1 is available. If the assigned timeslot is not yet available, the process again waits for timeslot 1. When timeslot 1 is available, the additional task is executed at step 213. The process continues in the same manner until all of the tasks of the test have been completed. In this way, during testing, if the verification process calls another task that might cause a task collision, the task will wait for its designated timeslot. In this example, the passed-in variable timeslot for each task will wait until it matches the top 3 bits in the counter, which is the counter at the top-level test bench. The same procedure applies for tests 2 to test N. Test 2 begins at step 212 and waits for timeslot 2 to become available at 209. When timeslot 2 is available, the task executes at step 215. Likewise, test N begins at step 214 and waits for timeslot N to become available at 217. When timeslot N is available, the task executes at 219. In this way each test can proceed simultaneously and tasks can be executed in assigned timeslots and will not collide with tasks called from any other tests.

Not all tasks, of course, will run the risk of a task collision. If any one or more of the tasks for a test would not conflict with tasks to be performed by another simultaneous test there is no need to assign the task a timeslot. In that case, the task will execute without going through the step of determining if a timeslot is available.

CONCLUSION

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. A method for performing simultaneous tests in a hardware description language verification, each test comprised of one or more tasks, the method comprising:

designating a unique timeslot for a plurality of the simultaneous tests;

associating one or more tasks to be performed with the timeslot designated for the test;

determining if the designated timeslot is available before executing the one or more tasks associated with the timeslot; and executing the one or more tasks associated with the timeslot when the designated timeslot becomes available.

2. The method of claim 1 wherein a counter counts the timeslots and the number of clock cycles for each timeslot.

3. The method of claim 1 wherein the task comprises an input variable for the designated timeslot.

4. The method of claim 1 wherein a subset of the tasks to be performed are associated with a timeslot.

5. The method of claim 4 wherein the subset of tasks is comprised of tasks for which a collision is possible.

6. A method for defining a task to be performed as a part of a hardware description language verification, the task comprising an input variable for defining a timeslot for execution of the task to avoid task collisions.

7. A task definition for a task to be performed as a part of a hardware description language test embodied in a computer-readable medium, the task definition comprising an input variable for defining a timeslot for execution of the task to avoid task collisions.

8. A method for performing simulations in a hardware description language, the simulation comprising a plurality of simultaneous tests, each test comprised of one or more tasks, the method comprising:

designating a timeslot for a test;

assigning the timeslot to a task of the test;

checking to determine if the timeslot is available and executing the task after determining the timeslot is available.

9. A method for performing a plurality of simultaneous tests in a hardware description language, each test comprised of one or more tasks, the method comprising:

designating a first timeslot for a first simultaneous test;

designating a second timeslot for a second simultaneous test;

associating one or more of the tasks to be performed as a part of the first simultaneous test with the first timeslot;

associating one or more of the tasks to be performed as a part of the second simultaneous test with the second timeslot;

determining if the first timeslot is available;

executing the tasks associated with the first timeslot;

determining if the second timeslot is available; and executing the tasks associated with the second timeslot.

10. The method of claim 9 wherein the tasks that may conflict comprise an input variable for a designated timeslot.

11. The method of claim 9 wherein a subset of the tasks to be performed are associated with a timeslot.

12. The method of claim 11 wherein the subset of tasks is comprised of those tasks for which a collision is possible.

13. The method of claim 9 wherein a free running counter is defined to determine the timeslots and the number of clock cycles for each timeslot.

14. A method for performing simultaneous tests and avoiding task collisions in a hardware description language comprising:

designating a discrete timeslot for one or more of the simultaneous tests;

associating the designated timeslot with one or more of the tasks to be performed in a test;

determining if the designated timeslot is available before executing the tasks associated with timeslots; and executing the tasks associated with timeslots when the associated timeslots become available.

15. A test environment for a hardware description language embodied in a computer-readable medium, comprising:

a discrete timeslot designated for one or more of the simultaneous tests; one or more tasks to be performed in a test associated with the designated timeslot;

a procedure for determining if the designated timeslot is available before executing the tasks associated with timeslots; and a procedure for executing the tasks associated with timeslots when the associated timeslot become available.

16. A simulation environment embodied in a computer-readable medium, the simulation environment comprising:

a plurality of tests, each test comprised of one or more tasks;

a timeslot designated for a test;

a task assigned to the timeslot;

a process for checking to determine if the timeslot is available; and a process for executing the task after determining the timeslot is available.

17. The simulation environment of claim 16 wherein there are a plurality of discrete timeslots designated for a plurality of tests.

18. A computer program embodied in a computer readable medium comprising a simulation environment, the simulation environment comprising:

a plurality of tests, each test comprised of one or more tasks;

a timeslot designated for a test;

a task assigned to the timeslot;

a process for checking to determine if the timeslot is available; and a process for executing the task after determining the timeslot is available.

19. A system comprising a hardware description language simulation environment, the simulation environment comprising:

a plurality of tests, each test comprised of one or more tasks;

a timeslot designated for a test;

a task assigned to the timeslot;

a process for checking to determine if the timeslot is available; and a process for executing the task after determining the timeslot is available.

* * * * *